United States Patent [19]

Davies

[11] Patent Number: 4,967,145
[45] Date of Patent: Oct. 30, 1990

[54] ACTIVE CURRENT TRANSFORMER

[75] Inventor: Christopher P. Davies, Fen Drayton, England

[73] Assignee: LGZ Landis & Gyr Zug, AG, Switzerland

[21] Appl. No.: 318,796

[22] Filed: Mar. 3, 1989

[30] Foreign Application Priority Data

Mar. 4, 1988 [GB] United Kingdom ............... 8805245

[51] Int. Cl.⁵ ..................... G01R 19/00; G01R 15/02
[52] U.S. Cl. .................................. 324/127; 324/126; 324/99 R; 324/117 R; 323/355; 323/356; 323/357
[58] Field of Search ............... 324/126, 127, 117 R, 324/117 H, 99 R, 99 D; 323/355, 356, 357

[56] References Cited

U.S. PATENT DOCUMENTS

| 2,779,908 | 1/1957 | Martin | 323/355 |
| 3,714,545 | 1/1973 | Chiffert | 323/358 |
| 3,815,013 | 6/1974 | Milkovic | 323/357 |
| 3,881,149 | 4/1975 | Kilo | 323/356 |
| 4,626,778 | 12/1986 | Friedl | 324/127 |

FOREIGN PATENT DOCUMENTS 0029903  6/1981  European Pat. Off. .
2135830  9/1984  United Kingdom .

Primary Examiner—Reinhard J. Eisenzopf
Assistant Examiner—Vinh P. Nguyen
Attorney, Agent, or Firm—Andrus, Sceales, Starke & Sawall

[57] ABSTRACT

An active current transformer has a primary conductor in which a current is to be measured and a secondary conductor in which a measuring current is generated in use. A feedback sensor provides an induced voltage and an amplifier receives a signal induced in the feedback sensor and generates the measuring current in the secondary conductor. The primary and secondary conductors are located in first and second magnetic circuits respectively, the first and second circuits having a common path over at least a part of their respective lengths. The feedback sensor is disposed on the common path of the first and second magnetic circuits so that, in use, the magnetic flux in the second path can be made substantially equal to that in the first path by operation of the amplifier in response to the voltage in the feedback sensor.

16 Claims, 3 Drawing Sheets

ACTIVE CURRENT TRANSFORMER

DESCRIPTION

The present invention relates to a so-called active current transformer of the type having a primary conductor which in use carries a current which is to be measured and a secondary conductor in which a measuring current is generated by means of a variable gain amplifier which receives a voltage induced in a magnetic flux sensor.

Various types of active transformer are known. For example, GB-A-2135830 discloses an active current transformer having a resistive shunt or current splitter for the primary current, a secondary winding and a detector winding, all located on a single magnetic path.

Active transformers are known in which the sensor has a feedback winding which drives the amplifier to develop a current in the secondary winding such as to generate a magnetic flux balancing that of the primary, to cause the signal in the feedback winding to approach zero. The number of turns in, or the current required to drive, the secondary conductor may be unacceptably large in such transformers. Accordingly, it is known to reduce the coupling between the primary and secondary conductors and to arrange for the feedback winding to pick up only a small part of the field from the primary conductor and to cause this to be cancelled by the secondary conductor current which is closely coupled to the feedback winding. EP-B-0144347 discloses such an active current transformer.

Such active current transformers find particular application in current measuring systems for example such as are used for measuring domestic electricity consumption. EP-A-0029903 discloses a current measuring device having a pair of separate transformers in which a secondary winding of one is connected to the secondary winding of the other and the circuit between them is connected to an operational amplifier whose output feeds the primary winding of the other transformer to provide a current which is then measured.

However, it is preferable, and an object of this invention, to avoid the need to wind the primary conductor since high current conductors are not easily formed and windings are thus expensive to manufacture. It is also desirable for the sensor ratio (number of turns of primary conductor x primary current):(number of turns of secondary conductor x secondary current) - not to have to vary with minor changes in the position of the primary conductor. An additional object is that the current sensor should be insensitive to the effect of magnetic fields other than those produced by the conductors in order that external magnetic fields should not be able to influence the meter.

According to the present invention therefore there is provided an active current transformer having a primary conductor in which a current is to be measured; a secondary conductor in which a measuring current is generated in use; a feedback sensor for providing an induced voltage; and an amplifier for receiving a signal induced in the feedback winding and generating the measuring current in the secondary conductor; characterised in that the primary and secondary conductors are located in first and second magnetic circuits respectively, the first and second circuits having a common path over at least a part of their respective lengths and the feedback winding being disposed on the common path of the first and second magnetic circuits whereby, in use, the magnetic flux in the second path can be made substantially equal and opposite to that in the first path by operation of the amplifier in response to the voltage in the feedback winding.

Thus the flux in the magnetic circuit of the primary conductor can be arranged to be relatively small in relation to the primary current whilst the secondary magnetic circuit can be arranged to carry a flux which is controlled by the structure of the magnetic circuit to be relatively large in relation to the secondary current. The amplifier is connected to arrange that the flux in the feedback sensor is substantially zero by driving the secondary winding to produce an equal and opposite flux to that produced by the primary conductor.

In order to enable satisfactory metering of electrical consumption using such a transformer the relationship between the current and the number of turns in the primary and secondary circuits is arranged to be substantially linear by the use of a combination of high permeability magnetic materials (operated out of saturation) and low permeability material gaps (for example air) of well defined areas and lengths.

The relationship between the low permeability gaps of the first and second magnetic circuits sets the sensor ratio which is required to achieve flux balance. For example, if the low permeability gaps have a fixed and equal length, but the cross section of the secondary gap is 25 times larger than the primary gap then the sensor ratio required to balance single turn of the primary conductor is 1:25 so that a primary current of say 200A in a single turn can be balanced by a secondary current of 2mA in a 4,000 turn secondary conductor.

This compares favourably with conventional active transformers which require considerably higher secondary currents or windings comprising many tens of thousands of turns.

Preferably, the gaps in the first and second magnetic circuits are not of air but are of a dimensionally stable non-ferromagnetic substance such as alumina and are arranged such that thermal expansion coefficients may cancel out one another as long as both gaps are subjected to the same external conditions.

The invention also includes a sensor assembly for an active current transformer as defined above, the sensor assembly comprising a housing assembly of magnetic material providing first and second magnetic circuits having a common path over a portion of their respective lengths; an aperture located in the first circuit, for housing a primary conductor; and a secondary conductor winding and a feedback sensor winding close coupled to one another in the common path of the first and second magnetic circuits.

An advantage of the construction according to the invention is that the effect of the primary conductor is substantially independent of minor variations in its position within the aperture.

Furthermore, the sensor ratio is insensitive to minor variations in the position of the primary conductor and the structure is self-screening.

Two examples of transformers constructed in accordance with the present invention will now be described with reference to the accompanying drawings in which.

Figure 1:
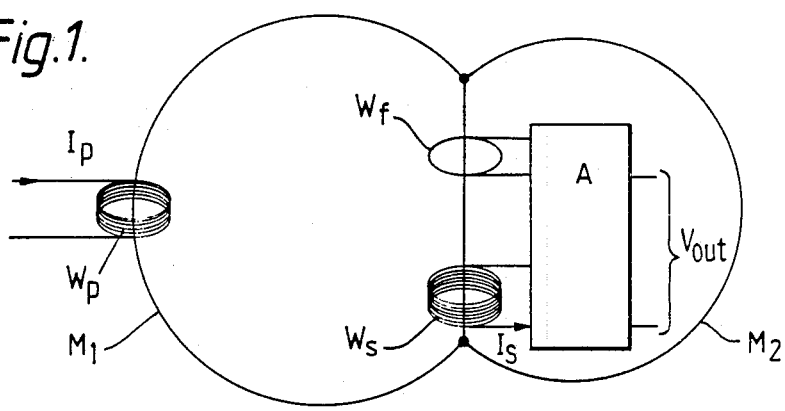
FIG. 1 is a magnetic circuit diagram illustrating the disposition of the magnetic circuit, the primary and secondary conductors and the feedback sensor and amplifier.

FIG. 1 illustrates diagrammatically, the arrangement of the various circuit elements in a transformer according to the invention, the transformer comprising primary and secondary conductor windings $W_p$ and $W_s$ and a feedback sensor in the form of a feedback winding $W_f$. The primary winding $W_p$, which may be a single U-shaped turn, is wound on a first magnetic circuit $M_1$ which has a common path over a portion of its length with a second magnetic circuit $M_2$. Both the secondary conductor winding $W_s$ and the feedback winding $W_f$ are wound on the common path of the two magnetic circuits, the feedback winding $W_f$ being closely coupled to the secondary winding $W_s$, so that the values of the flux passing through the sensor and secondary winding are the same. The secondary winding $W_s$ and feedback sensor $W_f$ are connected to an amplifier circuit A.

Figure 2:
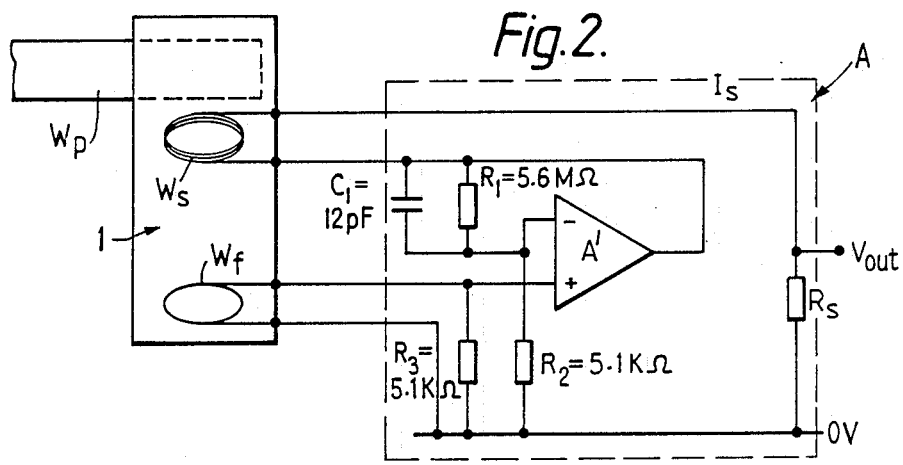
FIG. 2 is an electrical circuit diagram illustrating amplification details.

FIG. 2 shows the primary conductor $W_p$ (carrying a current $I_p$) passing by means of a single loop or "hairpin" turn through the sensor S in which are held both the secondary conductor $W_s$ and the feedback winding $W_f$. These are shown, again diagrammatically, in FIG. 2. The amplifier circuit is shown in more detail in FIG. 2 and includes an amplifier A', which has a high gain (typically greater than 1,000) and which is stable when in the configuration shown in FIG. 2. The amplifier A' (which in the example illustrated is an 'OP-27' from Precision Monolithics Inc.) is utilized to amplify the voltage across the feedback winding $W_f$, thereby controlling the current $I_s$ in the secondary winding $W_s$. The values of the other amplifier components are as shown, and the arrangement is set up such that the flux generated in the second magnetic circuit $M_2$ couples the secondary and feedback windings so as to balance that generated by the primary conductor, the feedback winding voltage thus being maintained substantially at zero. The resistor $R_s$ provides suitable conversion of the secondary current $I_s$ to an output voltage $V_{out}$ for measurement purposes.

FIGS. 3 to 6 show the proposed construction of the transformer of this example, the primary, secondary and feedback windings being housed in a ferrite core or housing 1 having a slot or aperture 2 for receipt of a hairpin or U-shaped winding of the primary conductor $W_p$ and an axially extending bore 3 having a counterbore 4 of radius $R_O$ and length $L_s$. A further aperture 7 is provided at the end of the housing opposite the aperture 2, in which second aperture are housed the secondary and feedback windings $W_s$ and $W_f$, these being wound on a generally cylindrical bobbin 5 in which, in turn, there is housed a ferrite rod 6 of radius $R_I$.

Figure 5:
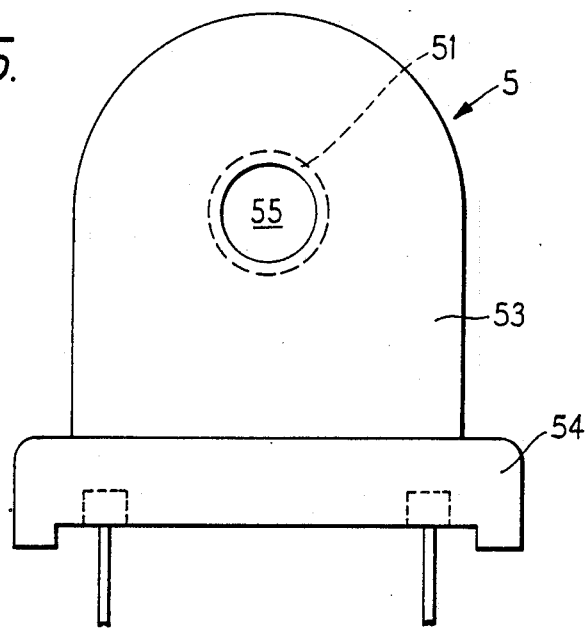
FIG. 5 is an end view of a bobbin on which the secondary and feedback conductors are wound.
Figure 6:
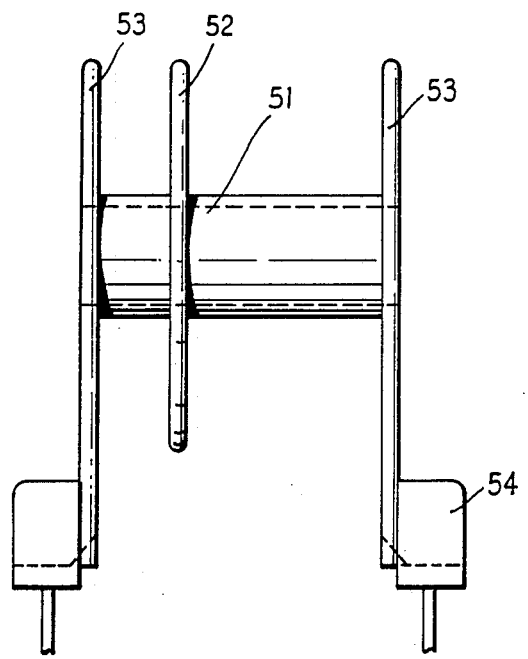
FIG. 6 is a side view of the bobbin.

The bobbin 5 is shown in more detail in FIGS. 5 and 6, and includes a cylindrical centre section 51, a disc like circular flange 52, to separate the secondary and feedback windings $W_s$ and $W_f$, and non-circular end flanges 53 as best seen in FIG. 5. A bore 55 passes through the bobbin to receive the ferrite rod 6, and the bobbin has mounting flanges 54 to receive electrical terminals for printed circuit board mounting.

In the structure shown, a magnetic flux normal to the end face of the ferrite rod is produced in the aperture of the primary conductor WP by current therein, the flux being intercepted by the end face of the rod 6 in accordance with its cross-section and the depth $L_p$ of the aperture 2 in which the primary conductor WP is housed.

Current in the secondary winding $W_s$ produces an opposing flux determined by the annular gap between the rod and the ferrite core which is controlled by the circuit according to the signal from the feedback winding $W_f$ as to produce zero net flux through the feedback winding.

The structure shown has the advantage that a hairpin bend or U-shaped loop of the primary conductor WP, which is easily formed, can simply be inserted into the aperture or slot 2 after construction of the sensor. Thus there is no requirement to "wind" the first conductor.

Also, the sensor ratio is insensitive to minor variations in the position of the primary conductor and the structure is self-screening. The sensor ratio is determined by the ratio of the two relevant magnetic reluctances: the annulus between the rod and the outer ferrite pressings and the cylinder defined by the effective end diameter of the rod and the gap which receives the primary loop. The 'effective end diameter' is approximately the mean diameter of the annulus R, so the sensor ratio S is given as:

S = Primary reluctance : Secondary reluctance $$\simeq 4L_p/\pi\ (R_O+R_I)^2 : (R_O-R_I)/\pi(R_O+R_I)L_S$$

when $R_O-R_I$ is much less than $R_O+R_I$.

The symmetry of the construction also reduces its sensitivity to external magnetic fields and both the secondary and feedback windings can be wound on the same bobbin thus simplifying construction.

Construction is further simplified if the ferrite core is formed in two halves as shown. These and the ferrite rod can be formed by simple pressing techniques, dimensional stability being controlled by the respective sizes and shapes of the core halves and rod.

Figure 7:
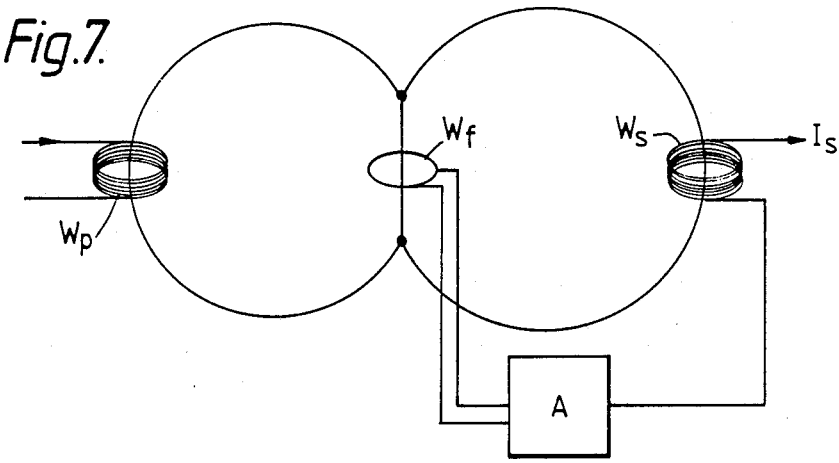
FIG. 7 shows an alternative magnetic circuit arrangement which may be utilized.
Figure 3:
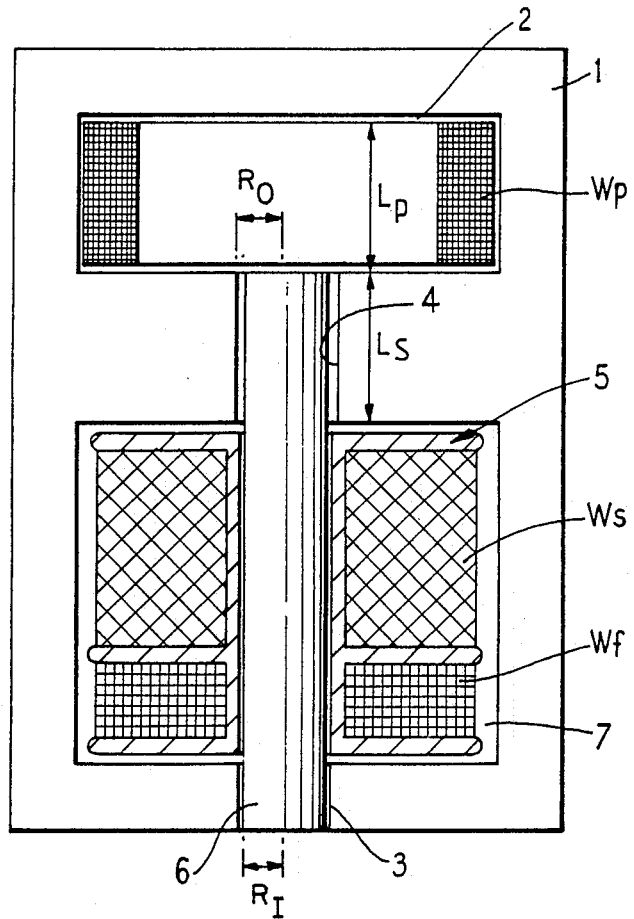
FIG. 3 is a cross-section through the transformer.
Figure 4:
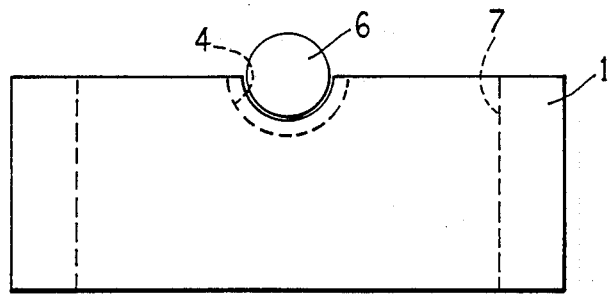
FIG. 4 is an end view of one half of the transformer.

FIG. 7 illustrates an alternative construction in which the feedback winding $W_f$ and the secondary winding $W_s$ are not close-coupled, being disposed in different parts of the magnetic circuit $M_2$.

I claim:

1. An active current transformer comprising:
   first and second magnetic circuits;
   a primary conductor in which a current is to be measured;
   a secondary conductor in which a measuring current is generated in use;
   a feedback sensor, said sensor providing an induced voltage; and
   an amplifier for receiving a signal induced in said feedback sensor and generating said measuring current in said secondary conductor; wherein said primary and secondary conductors are located in said first and second magnetic circuits respectively, said first and second circuits having a common path over at least a part of their respective lengths and said feedback sensor being disposed on said common path, whereby, the magnetic flux in said second circuit can be made substantially equal and opposite to that in said first circuit by operation of said amplifier in response to said voltage in said feedback sensor.

2. A transformer according to claim 1, wherein said secondary conductor is located in said common path of said first and second magnetic circuits.

3. A transformer according to claim 2, wherein said feedback sensor and said secondary conductor are close-coupled.

4. A transformer according to claim 1, wherein said secondary conductor is located in the part of said second magnetic circuit that is not common with said first magnetic circuit.

5. A transformer according to claim 1, wherein at least one of said primary conductor, said secondary conductor, and said feedback sensor is a coil.

6. A transformer according to claim 1, wherein said amplifier is connected to arrange that the flux in said feedback sensor is substantially zero by driving said secondary conductor to produce an equal and opposite flux to that produced by said primary conductor.

7. A transformer according to claim 1, wherein a portion of each of said first and second magnetic circuits consists of a low permeability material.

8. A transformer according to claim 7, wherein said low permeability material is air.

9. A transformer according to claim 7, wherein said low permeability material is a dimensionally stable solid.

10. A transformer according to claim 1, including a ferrite housing, said ferrite housing defining said first and second magnetic circuits, and wherein said secondary conductor and feedback sensor are housed therewithin.

11. A transformer according to claim 10, including a bobbin, and wherein said secondary conductor and feedback sensor are coils, and said coils are wound on said bobbin.

12. A transformer according to claim 11, wherein said housing defines an aperture, said primary conductor being located in said aperture.

13. A transformer according to claim 10, wherein said housing defines an aperture, said primary conductor being located in said aperture.

14. A transformer according to claim 10, wherein said primary conductor comprises a U-shaped winding, and wherein said housing defines an aperture, said primary conductor being received in said aperture.

15. A transformer according to claim 1, wherein said primary conductor comprises a U-shaped winding.

16. A sensor assembly for an active current transformer, said sensor assembly comprising:
 a housing assembly of magnetic material, said housing assembly defining first and second magnetic circuits, said circuits having a common path over a portion of their respective lengths, and said first circuit defining an aperture for housing a primary conductor;
 a secondary conductor winding located in said second magnetic circuit; and
 a feedback sensor winding close coupled to said secondary winding and disposed in said common path of said first and second magnetic circuits.

* * * * *